(12) United States Patent
Patel et al.

(10) Patent No.: US 7,827,679 B1
(45) Date of Patent: Nov. 9, 2010

(54) THERMAL MANAGEMENT CIRCUIT BOARD AND METHODS OF PRODUCING THE SAME

(75) Inventors: Rati M. Patel, 637 W. Meadowgate Dr., Springfield, MO (US) 65803; Roy English, 250 Winston La., Bloomingdale, IL (US) 61018

(73) Assignees: Rati M. Patel, part interest; Roy English, part interest ( * ) Notice: Subject to any disclaimer, the term of this patent is extended or adjusted under 35 U.S.C. 154(b) by 947 days.

(21) Appl. No.: 11/407,812

(22) Filed: Apr. 20, 2006

(51) Int. Cl.
  *H05K 3/36* (2006.01)
(52) U.S. Cl. .......................... 29/830; 29/846
(58) Field of Classification Search ................ 174/252; 361/676–678, 719–722; 29/830, 846
See application file for complete search history.

(56) References Cited

U.S. PATENT DOCUMENTS

| | | | |
|---|---|---|---|
| 4,999,740 A | | 3/1991 | Ilardi et al. |
| 5,287,247 A | | 2/1994 | Smits et al. |
| 5,596,231 A | * | 1/1997 | Combs ........................ 257/776 |
| 5,857,767 A | | 1/1999 | Hochstein |
| 6,295,200 B1 | * | 9/2001 | Schmidt ...................... 361/704 |
| 6,297,959 B1 | | 10/2001 | Ueno et al. |
| 6,874,910 B2 | | 4/2005 | Sugimoto et al. |

OTHER PUBLICATIONS

Thermal Substrates: T-Clad, Bergquist Company, 18930 W. 78th Street, Chanhassen, MN 55317.

Nancy Dean, Materials for Thermal Management, Advance Packaging, On-line publication.

* cited by examiner

*Primary Examiner*—Jeremy C Norris
(74) *Attorney, Agent, or Firm*—Richard L. Marsh

(57) ABSTRACT

A thermal management circuit board comprises a heat sink, at least one insulating layer and at least one electronic circuit. The heat sink comprises a heat conducting material having tooling holes disposed therethrough and raised portions disposed on at least one surface thereof. The raised portions of the heat sink provide mounting surfaces for heat producing electronic components on a plane above a chemically etched surface of the heat sink. The electronic circuit comprises a prepreg and a circuit material wherein the circuit material is laminated to the prepreg, has a photoresist laid thereupon with at least one circuit image printed thereupon. The photoresist is then developed and the circuit material is chemically etched to define a circuit trace of the electronic circuit. The insulating layer comprises a thermally and electrically resistant material and has apertures disposed therethrough corresponding in size and shape to the raised portions of the heat sink. The circuit trace has an upper surface for receiving surface mount electronic components thereupon and the electronic circuit also has apertures disposed therethrough corresponding in size and location to the raised portions of the heat sink. The insulating layer, the electronic circuit and the heat sink are laminated together with heat and pressure with the raised portions disposed through the apertures wherein the plane of the mounting surfaces of the heat sink is on the same plane as the upper surface of the circuit trace of the electronic circuit.

2 Claims, No Drawings

THERMAL MANAGEMENT CIRCUIT BOARD AND METHODS OF PRODUCING THE SAME

BACKGROUND OF THE INVENTION

1. Field of the Invention

This invention relates to a method of making a thermal management circuit board or a thermal management circuit board panel with printed circuits formed thereon.

2. Prior Art Statement

Many components used in electronic assemblies generate large amounts of heat during operation. Such heat, if not removed, can cause premature failure of the component, the circuit board it is mounted on and/or the surrounding electronic devices. In extreme cases, if the heat coming from the electronic device is not dissipated or removed from the mounting area, component fire and/or entire system failure could occur. A study of the prior art shows that presently available constructions employ such methods as:

1. Heat dissipating metal heat sinks applied to the component.
2. Circuit boards utilizing thin thermally conductive dielectric materials attached to a metal substrate.
3. Areas milled in a circuit board exposing an underlying metal substrate that a component can rest upon.

While able to dissipate the heat of the component, or circuit to some extent, issues are still present in the heat dissipation, as the component is not directly attached to an underlying metal core (1 and 2 above), even though the core is often attached to supports for heat reduction.

In cases where the dielectric area is removed and the component is placed on the core (#3 above), surface mount devices cannot be used because the leads must be on the same plane as the bottom on the device. Additionally these types of boards often require additional layers for electrical interconnections. With high heat generating electronic components becoming commonplace in electronic circuits thus requiring management of the thermal characteristics, problems with the assembly of the electrical components to the circuit board also arise, especially with surface mount components. Miniaturized surface mount components often rely upon the circuit trace to dissipate heat from the component which is inefficient. In other surface mount devices, a heat sink is placed upon the exposed surface of the heat generating component requiring another costly step in the manufacture of the circuit. Thus, there is a need to provide a thermal management circuit board for surface mount components that has raised portions on the heat sink material registered with apertures through the electrically isolating material and the prepreg between the circuit traces such that the surface mount component is placed directly upon the raised portion of the heat sink therefore improving thermal management of the circuit board.

It is known to provide a printed circuit board comprising a laminated metal substrate designed for dissipating heat having a curable dielectric material located on the substrate, wells in the dielectric material contacting the substrate created by masking the curable dielectric material at the location of the wells, the wells further having active circuit components mounted therein which contact the substrate, the laminated metal substrate having a coefficient of thermal expansion which matches that of the active circuit components. For instance, see the U.S. Pat. No. 4,999,740 issued on Mar. 12, 1991 to Ilardi, et al. Thus, though thermal management of a circuit is achieved by removing the dielectric material in the area of heat generating circuit components, it has been found that this is impossible with surface mount circuit boards as described above where the surface mount component must be re-flow soldered to the circuit trace on the same plane as the bottom of the component. Thus, the need to have surface mount components mounted directly upon raised portions of the heat sink is desirable thus placing the bottom of the component directly on the heat sink while allowing re-flow soldering of the component to the trace.

It is also known to provide a method of preparing a circuit board on a dielectric and then applying the circuit to the circuit board with a heat conductive medium placed between the circuit board and the component. A silicon grease is coated on the circuit board side of the heat producing element and a projecting portion of a heat sink is inserted through a through hole under the heat producing element. The projecting portion and the circuit board are placed in contact with the heat sink and the circuit board is affixed to the heat sink with Mylar® tape. Contact with the heat producing element is through the silicon grease. Excessive silicon grease is collected in a step portion provided into the heat sink in an area surrounding a projection portion contact platform. The bottom surface of the circuit board and the bottom surface of the projection portion are on the same plane, that plane coincident with the top of the heat sink. For instance, see the U.S. Pat. No. 6,297,959 B1 issued on Oct. 2, 2001 to Ueno, et al. The multiple steps in this process makes manufacture of circuit boards cost prohibitive. In addition, it is impossible to secure miniaturized circuit components with Mylar® tape and equally impossible to secure a heat sink to a circuit board having a plurality of miniaturized circuit components surface mounted thereupon. Therefore, there is a great need for a method of directly mounting surface mount components to a heat sink in the process of securing the component to a circuit board.

In addition, it is known to provide a heat sink which has a "button" on its inner surface extending through a circuit board. The button is affixed to the heat generating semiconductor with a thermally conductive adhesive device and relies upon the thermally conductive adhesive to transfer heat away from the device to the heat sink. For instance, see the U.S. Pat. No. 5,287,247 issued on 15 Feb. 1994 to Smits, et al. Mechanical registry of a single button with a single heat generating semiconductor is possible, however, when multiple high heat generating components are to be mounted to a single board within a confined space, mechanical registry of the heat sink with the heat generating components is impossible. Thus, there is a strong desire to provide a thermal management circuit board with raised portions of a heat sink disposed on the same plane as the upper surface of the circuit trace to enhance mounting of multiple components to the heat sink while attaching the leads of the components to the circuit trace.

It is further known to provide a method of manufacturing an electrically driven LED lamp assembly comprising the steps of disposing an electrically insulating coating of less than 1000 microns thickness over an electrically and thermally conductive, entirely metal heat sink, printing circuit traces on the coating and adhesively securing light emitting diodes to the circuit traces with an electrically and thermally conductive adhesive. For instance, see U.S. Pat. No. 5,857,767 issued on Jan. 12, 1999 to Peter A. Hochstein. Hochstein provides thermal management at circuit assembly by avoiding the soldering of components to the circuit board, however it has been found that the teachings of Hochstein cannot be applied to surface mount components. Thus, there is still a great need for a method of mounting surface mount components directly upon raised portions of a heat sink with the circuit trace on the same plane as the raised portion of the heat sink.

Also known is to provide a circuit board panel comprising a copper or aluminum substrate, a layer of epoxy and a layer of copper wherein the layer of epoxy contains finely comminuted, thermally conductive, electrically insulating material such as a ceramic material. For instance, see the technical bulletin entitled *Thermal Clad© Overview* available from The Bergquist Company, 18930 W. 78th Street, Chanhassen, Minn. 55317 USA. Though thermal management of a circuit board is enhanced by providing thermally conductive material in the layer of epoxy, direct contact with the heat sink has not been taught and therefore there is still a need for a circuit board having a means for mounting surface mount components in direct contact with raised portions of the heat sink to allow for simultaneous mounting of the leads of a heat generating component and the base thereof to the heat sink.

Finally, it is known to mount a heat producing light emitting diode (LED) in intimate contact with a projection integrally formed on a heat sink with the top of the heat sink projection on the same plane as the top of the circuit board traces wherein an insulating member is provided with a through hole exactly the same diameter as the projection and is adhered to the heat sink with an adhesive. The insulating member is additionally formed with cup-shaped cavities which direct the light emitting from the LED's. For instance, see the U.S. Pat. No. 6,874,910 B2 issued on Apr. 5, 2005 to Sugimoto, et al. Precision forming by mechanical processes is cost prohibitive for most circuit board manufacture as is precision forming of insulating members. Thus, the need for a cost effective and simple procedure for producing thermal management circuit boards is greatly needed.

SUMMARY OF THE INVENTION

According to an article by Nancy Dean entitled Materials for Thermal Management found in Advanced Packaging, March 2003, "Four approaches can be taken to reduce thermal resistance: (1) increase thermal conductivity (k) of the interface materials and heat spreaders, (2) increase wetting or bonding to decrease contact resistance (q contact) at the surface, (3) increase flatness of the spreader to decrease the thickness (t) of the interface to reduce heat transfer path, and (4) eliminate one of the interfaces in the heat sink package." One object of this invention is to improve contact between heat generating components and the heat sink by placing heat generating components in direct contact with raised portions of the heat sink to reduce thermal resistance.

Though thermal management of circuit panels and circuit boards for elevated components has been addressed by providing a direct contact of a portion of a component with the heat sink, these circuit boards and circuit panels cannot be used for surface mount components, nor can the method of making the circuit board or panel described in the prior art be used for surface mount heat generating components. Therefore, it is an object of this invention to provide method of fabricating a thermal management circuit board comprises the steps of providing a heat sink material, providing tooling holes through the heat sink material, laminating a photoresist on at least one surface of the heat sink material, printing at least one image on the photoresist, developing the photoresist, chemically etching the surface of the heat sink material around the image and chemically stripping the photoresist leaving raised portions of the heat sink material in an area subscribed by the image at a plane above the chemically etched surface, thus constituting a heat sink; providing a prepreg and a circuit trace material, laminating the circuit trace material to the prepreg, laminating a photoresist on the circuit trace material, printing at least one circuit image on the photoresist, developing the photoresist, chemically etching the circuit trace material around the circuit image and chemically stripping the photoresist leaving an electronic circuit upon the prepreg in areas subscribed by the circuit image, thus constituting an electronic circuit board; providing apertures through the electronic circuit board corresponding in size and location to the raised portions of the heat sink, applying an electrically insulating material to the electronic circuit board and laminating the heat sink, the electrically insulating layer and the electronic circuit board together with heat and pressure.

Another object of this invention is to provide a circuit board construction method with a direct heat transfer from a component to an underlying metal substrate. This type of circuit board is for the thermal management of high temperature components during assembly and operation. The board will dissipate the required amount of heat from an operating component insuring safe operation. Components can be attached directly to a metal heat sink, which is part of the metal core imbedded in, or laminated to, a print circuit board. This is accomplished without milling (insuring the base of the component is on the same level as the leads for surface mount devices) or using a laminate or prepreg for thermal transfer under the component or circuit.

A primary goal of this invention is to provide for the design and method of construction of thermally conductive circuit boards for thermal management which are fabricated such that the component is resting on a raised area on the metal core, which surface is at the same height as the surrounding circuitry but is part of the metal core.

A significant feature of this invention is to provide raised portions on a heat sink material by laminating a photoresist on at least one surface of the heat sink material, printing at least one image on the photoresist, developing the photoresist, chemically etching the surface of the heat sink material around the image and chemically stripping the photoresist leaving portions of the heat sink extending above a chemically etched surface.

A main purpose of this invention is to provide heat sink for thermal management of an electronic circuit which comprises a heat conducting material having tooling holes disposed therethrough and raised portions disposed on at least one surface thereof. The raised portions of the heat sink provide mounting surfaces for heat producing electronic components on a plane level with a circuit trace which is subsequently laminated to the heat sink. The heat sink material has a photoresist laid thereupon with at least one image of a heat generating component printed thereupon, the photoresist is developed, the heat sink material is then chemically etched and chemically stripped from the heat sink material to define at least one raised portion spaced above a chemically etched surface of the heat sink material in an area subscribed by the image of the component at a plane above the chemically etched surface.

DESCRIPTION OF THE PREFERRED EMBODIMENTS

While the various features of this invention are hereinafter described and illustrated as a thermal management circuit board and a method of making the same, it is to be understood that the various features of this invention can be used singly or in various combinations thereof for thermal management circuit boards, circuit board panels and the like as can hereinafter be appreciated from a reading of the following description.

In this invention, the following industry standard terms are used.

Dry Film Photoresist: Solid photoresist applied to a surface by lamination of prefabricated film.

Prepreg: Partially-cured fiber-reinforced resin fabric. Also referred to as the B-stage in the manufacturing of PCB.

Printed Circuit Board (PCB)/Printed Wiring Board (PWB): The term generally used for printed circuit configurations such as rigid or flexible, single, double, or multilayered boards that are completely processed. A PCB or PWB is a substrate of a glass fabric impregnated with a resin (usually epoxy) and cured and clad metal (almost always copper) upon which a pattern of conductive traces is formed to interconnect components.

Reflow Soldering The process of joining two metallic surfaces (without the melting of base metals) attained through the heating of predeposited solder paste to subsequently form solder fillets at the metallized areas.

Reflow: The application of heat to a surface containing a thin deposit of a low melting point metal or alloy (e.g., solder paste tin lead alloy), resulting in the melting of the deposit, followed by its solidification.

Solder Mask: A dielectric material used to cover the entire surface (except where the joints are to be formed) of the PCB primarily to protect the circuitry from environmental damage. Solder mask also helps to reduce bridging.

Surface Mount Technology: A method of assembling printed circuit boards where the components are mounted onto the surface of the board rather than being inserted into holes in the board.

Tape Automated Bonding (TAB): The process where silicon chips are joined to patterned metal traces (leads) on polymer tape to form inner leads bonds and subsequently the leads are attached to the next level of the assembly, typically a substrate or board, to form outer lead bonds. TAB is the technique of interconnecting silicon with beam bonding as opposed to wire bonding.

Tooling Holes (or Alignment Holes): Holes specifically designed in TAB tape for registration of a TAB frame. These holes can be located virtually anywhere on the tape site, however, locations are standardized in many cases.

In accordance with the teachings of this invention, heat producing components of a circuit are first identified and strategically placed on a circuit board design. Placement of each specific heat generating component is predicated upon proximity to other heat generating components, the amount of heat produced by each component and the radiating capacity of appropriate heat sink materials. Upon completion of calculations to determine effective management of the total heat being generated by the entire circuit board, artwork is created that defines areas where the heat generating components will be placed in order to effectively remove the amount of heat generated by the circuit components. A heat sink material is selected from the group comprising copper, brass, bronze, aluminum, steel, ceramic or combinations of the above. The heat sink material is cut to the specific size of the intended circuit board and provided with tooling holes for use in subsequent processes, affixing of other components, mounting other circuit boards and to mount the finished circuit board to the final product. At least one surface is de-burred by processes well known in the art, however, may be fully prepared as recited in U.S. Pat. No. 6,973,719 B1 issued on Dec. 13, 2005 to Patel, et al., the inventors of the instant invention, the entirety of the teachings of this patent incorporated into this invention by this reference thereto. A photoresist is laminated upon at least one cleaned surface of the heat sink material by the well known and practiced process of circuit preparation. Here, though, printing of at least one image of the area substantially the size of the footprint of each heat generating element on the photoresist is accomplished in order to establish at least one raised portion on the heat sink material as will become readily apparent. Upon completion of the printing of the images, developing the photoresist allows for chemically etching the surface of the heat sink material around the image of the footprint of each heat producing component. By chemically stripping the photoresist, raised portions of the heat sink material are left in the areas subscribed by the images at a plane above the chemically etched surface, thus constituting a heat sink having raised portions at specified locations for the heat generating components. The heat sink is then rinsed with clean water for up to two minutes, dried and passivated as set forth in the above incorporated U.S. Pat. No. 6,973,719 B1 to the inventors hereof. Upon passivating, the heat sink with raised portions is baked at 250 to 300 degrees F. for 15 to 30 minutes.

Circuit layers and/or subassemblies are produced in the well known standard printed circuit manufacturing techniques by providing a prepreg and a circuit material, laminating the circuit material to the prepreg, laminating a photoresist on the circuit material, printing at least one circuit image on the photoresist, developing the photoresist, chemically etching the circuit material around the circuit image and chemically stripping the photoresist leaving an electronic circuit trace upon the prepreg in areas subscribed by the circuit image, thus constituting an electronic circuit board. Apertures are provided through the electronic circuit board corresponding in size and location to the raised portions of the heat sink. An electric insulating material is produced having apertures therethrough in the same location as the raised portions on the heat sink. The electric insulating material may alternately be applied to the electronic circuit board or directly upon the chemically etched surface of the heat sink. If produced separately, the heat sink, the electric insulating material and the electronic circuit board are assembled in that order and laminated together with heat and pressure. Where the electric insulating material is provided on either the electronic circuit board or on the heat sink, the heat sink and the electronic circuit board are assembled with the electric insulating material arranged in proximity to the other element and laminated together under heat and pressure. Lamination is done in a laminating press at a temperature of 340 to 375 degrees Fahrenheit for 45 for 90 minutes though different times and/or different temperatures may be used without departing from the scope of this invention.

Alternately, the heat sink material may produced as recited above and laminated with a prepreg and the circuit material under heat and pressure, the circuit material and prepreg having apertures provided therethrough in the areas of the raised portions of the heat sink. Upon completion of the lamination, excess resin from the prepreg is chemically removed from the top surfaces of the raised portions. The circuit material and top surface of the raised portions are at substantially the same plane. The entire surface is then mechanically scrubbed, cleaned, rinsed and dried as described in the aforementioned U.S. Pat. No. 6,973,719 B1. The photoresist for circuit traces is then laminated to the circuit material and the top surface of the raised portions of the heat sink. The circuit image and the footprints of the raised portions is then printed on the photoresist. The photoresist is then developed. Chemical etching of the circuit material leaves the circuit traces and the footprints of the heat sink on the same plane above the prepreg. The photoresist is stripped from the circuit trace surface and the circuit traces inspected. Thereafter, a solder mask is applied ready to receive surface mount components.

While the present invention has been described with reference to the above described preferred embodiments and alternate embodiments, it should be noted that various other embodiments and modifications may be made without departing from the spirit of the invention. Therefore, the embodiments described herein and the drawings appended hereto are merely illustrative of the features of the invention and should not be construed to be the only variants thereof nor limited thereto.

We claim:

1. A method of fabricating a thermal management circuit board comprises the steps of providing a heat sink material, providing tooling holes through said heat sink material, laminating a photoresist on at least one surface of said heat sink material, printing at least one image on said photoresist, developing said photoresist, chemically etching said surface of said heat sink material around said image and chemically stripping said photoresist leaving raised portions of said heat sink material in an area subscribed by said image at a plane above said chemically etched surface, thus constituting a heat sink; providing a prepreg and a circuit trace material, laminating said circuit trace material to said prepreg, laminating a photoresist on said circuit trace material, printing at least one circuit image on said photoresist, developing said photoresist, chemically etching said circuit trace material around said circuit image and chemically stripping said photoresist leaving an electronic circuit upon said prepreg in areas subscribed by said circuit image, thus constituting an electronic circuit board; providing apertures through said electronic circuit board corresponding in size and location to said raised portions of said heat sink, applying an electrically insulating material to said electronic circuit board and laminating said heat sink, said electrically insulating layer and said electronic circuit board together with heat and pressure.

2. A method as in claim 1 wherein said heat sink material is selected from the group comprising copper, brass, bronze, aluminum, steel, ceramic or combinations of the above.

\* \* \* \* \*